United States Patent [19]
Tsuji et al.

[11] Patent Number: 5,849,463
[45] Date of Patent: Dec. 15, 1998

[54] PHOTOSENSITIVE COMPOSITION

[75] Inventors: Shigeo Tsuji; Akihisa Murata, both of Yokohama; Toshiyuki Matsumura, Hino; Nobuyuki Ishii, Hino; Noriyuki Kidu, Hino, all of Japan

[73] Assignees: Mitsubishi Chemical Corporation; Konica Corporation, both of Tokyo, Japan

[21] Appl. No.: 879,368

[22] Filed: Jun. 20, 1997

Related U.S. Application Data

[62] Division of Ser. No. 730,175, Oct. 15, 1996, abandoned, which is a continuation of Ser. No. 398,666, Mar. 3, 1995, abandoned.

[30] Foreign Application Priority Data

Mar. 3, 1994 [JP] Japan .................................. 6-033740

[51] Int. Cl.$^6$ ....................................................... G03F 7/00
[52] U.S. Cl. ......................... 430/302; 430/157; 430/175; 430/176; 430/281.1; 430/283.1; 430/285.1; 430/913
[58] Field of Search ..................... 430/168, 175, 430/176, 910, 157, 281.1, 283.1, 302, 300, 913, 285.1

[56] References Cited

U.S. PATENT DOCUMENTS

| | | | |
|---|---|---|---|
| 4,564,580 | 1/1986 | Ichimura et al. | 430/175 |
| 5,059,511 | 10/1991 | Higashi et al. | 430/272 |
| 5,080,999 | 1/1992 | Imai et al. | |
| 5,427,887 | 6/1995 | Konuma et al. | 430/175 |

FOREIGN PATENT DOCUMENTS

| | | |
|---|---|---|
| 0 583 962 | 2/1994 | European Pat. Off. |
| 57-43890 | 9/1982 | Japan . |
| 1-102456 | 4/1989 | Japan . |
| 1-102457 | 4/1989 | Japan . |
| 1-254949 | 10/1989 | Japan . |
| 2-66 | 1/1990 | Japan . |
| 2-111948 | 4/1990 | Japan . |
| 4-211253 | 8/1992 | Japan . |
| 5-43101 | 6/1993 | Japan . |

*Primary Examiner*—Thorl Chea
*Attorney, Agent, or Firm*—Oblon, Spivak, McClelland, Maier & Neustadt, P.C.

[57] ABSTRACT

A photosensitive composition comprising (1) a compound having at least one addition-polymerizable ethylenically unsaturated double bond, (2) an acidic vinyl copolymer soluble or swellable in alkaline water, which contains, in its molecule, a vinyl monomer having an aromatic hydroxyl group, as a constituting unit, (3) a photopolymerization initiator, and (4) a diazo resin, wherein the diazo resin is a copolycondensed compound which contains, in its molecule, an aromatic compound having a carboxyl group and/or a hydroxyl group, and an aromatic diazonium compound, as constituting units.

14 Claims, No Drawings

PHOTOSENSITIVE COMPOSITION

This application is a division of application Ser. No. 08/730,175, filed on Oct. 15, 1996, abandoned, which is a continuation of Ser. No. 08/398,666, filed on Mar. 3, 1995, abandoned.

The present invention relates to a photosensitive composition, particularly a photosensitive composition suitable for a negative photosensitive lithographic plate. More particularly, it relates to a photosensitive composition which can be developed with an alkali developer containing no organic solvent.

A negative photosensitive lithographic plate is usually prepared in such a manner that a photosensitive composition is coated on a support such as an aluminum plate to form a photosensitive layer, then active light rays such as ultraviolet rays are irradiated through a negative image, so that the portions irradiated with the light will be polymerized or cross-linked to be insoluble in a developer, and non-irradiated portions are dissolved in the developer, to make the respective portions, image portions which repel water and receive ink and non-image portions which receive water and repel ink.

As a component for the photosensitive layer in such a case, it has been attempted to add a diazo resin to the photopolymerizable components. For example, Japanese Examined Patent Publication No. 43101/1993 discloses a photosensitive composition comprising ① an ethylenically unsaturated polymer compound, ② a vinyl copolymer having an allyl group and a nitrile group and/or a hydroxyl group, at a side chain, ③ a photopolymerization initiator and ④ a diazo resin. However, the vinyl copolymer and the diazo resin have no substantial alkali-solubility, and if a photosensitive lithographic plate having the above-mentioned photosensitive composition is exposed and then developed with an alkali developer containing no organic solvent, a film is likely to remain at the portion from which the film should be removed, whereby there will be a problem that the printing properties are poor.

On the other hand, Japanese Examined Patent Publication No. 43890/1982 discloses a vinyl copolymer containing aromatic hydroxyl groups, and Japanese Unexamined Patent Publications No. 102456/1989, No. 102457/1989, No. 254949/1989 and No. 66/1990 disclose copolycondensed compounds comprising an aromatic compound having at least one of a carboxyl group and a hydroxyl group, and an aromatic diazonium compound, as constituting units. However, if a photosensitive lithographic plate containing such an alkali soluble component in the photosensitive layer, is developed with an alkali developer containing no organic solvent, the photosensitive layer has poor resistance to alkali, whereby there will be a problem such that during the development, a scar is likely to form in the image line portion, or the bond strength of the photosensitive layer to the support tends to deteriorate. Further, Japanese Unexamined Patent Publication No. 211253/1992 discloses a combination of a sulfoneamide group-containing polymer compound and an alkali-soluble copolycondensed diazo resin. However, even this combination fails to provide adequate performance.

Further, if a photosensitive lithographic plate containing such an acidic vinyl copolymer and an alkali-soluble diazo resin in the photosensitive layer, is subjected to a fatigue test under a high temperature high humidity condition and then developed with an alkali developer, there will be a problem that the image portion peels off from the support during the development, or printing resistance is extremely poor in printing.

It is an object of the present invention to solve the above-mentioned problems and to provide a photosensitive composition whereby adequate printing resistance is obtainable without printing smudges, even when applied to printing, i.e. a photosensitive composition whereby desired development can be accomplished even when developed with an alkali developer containing no organic solvent, and which is free from deterioration of the performance even after storage under high temperature high humidity conditions.

The present inventors have conducted extensive studies to solve the above problems and as a result, have found that by combining a specific binder resin and a specific diazo resin to a polymerizable monomer, it is possible to obtain a photosensitive composition excellent in all of the alkali developing property, the printing resistance and the storage stability. The present invention has been accomplished on the basis of this discovery.

Namely, it is an object of the present invention to provide a photosensitive composition which is excellent in all of the alkali developing property, the printing resistance, the smudging resistance and the storage stability.

Such an object of the present invention can be readily accomplished by a photosensitive composition comprising (1) a compound having at least one addition-polymerizable ethylenically unsaturated double bond, (2) an acidic vinyl copolymer soluble or swellable in alkaline water, which contains, in its molecule, a vinyl monomer having an aromatic hydroxyl group, as a constituting unit, (3) a photopolymerization initiator, and (4) a diazo resin, wherein the diazo resin is a copolycondensed compound which contains, in its molecule, an aromatic compound having a carboxyl group and/or a hydroxyl group, and an aromatic diazonium compound, as constituting units.

Now, the present invention will be described in detail.

In the present invention, the compound (1) having at least one addition-polymerizable ethylenically unsaturated double bond (hereinafter referred to simply as the "ethylenic compound") is preferably the one containing an acryloyl group or a methacryloyl group.

As an example having one addition-polymerizable ethylenically unsaturated double bond, a linear or cyclic alkyl (meth)acrylate, a (meth)acrylate of an aromatic alcohol, a mono(meth)acrylate of a polyhydric alcohol, a polyethylene oxide (meth)acrylate, a polypropylene oxide (meth)acrylate, a fluorinated alkyl (meth)acrylate, a glycidyl (meth)acrylate, a hydroxy group-containing alkyl (meth)acrylate, or an alkoxy group-containing alkyl (meth)acrylate may usually be mentioned.

As an example having two or more addition polymerizable ethylenically unsaturated double bonds, a compound introduced groups having two or more addition polymerizable ethylenically unsaturated double bonds to a polyhydric alcohol or a polyhydric phenol, is preferably employed.

As a method for introducing such addition-polymerizable unsaturated bonds, a method may firstly be mentioned in which acryloyl groups or methacryloyl groups are introduced to a polyhydric alcohol or a polyhydric phenol by ester linkage. As an example for the polyhydric alcohol which can be used for this method, a linear or cyclic alkanediol, a polyethylene oxide, a polypropylene oxide, an ethylene oxide-modified alkanediol, a propylene oxide-modified alkanediol, an ethylene oxide-modified polyhydric phenol, a propylene oxide-modified polyhydric phenol, an ethylene oxide-modified bisphenol, a propylene oxide-modified bisphenol, a condensation product of polyethylene oxide and polypropylene oxide, trimethylolpropane, pentaerythritol, dipentaerythritol, diglycerol, triglycerol, trishydroxyethyl isocyanurate, may preferably be employed. Further, a compound having two or more acryloyl groups or methacryloyl groups introduced to a polyol having hydroxyl groups of such a polyhydric alcohol modified with e.g. ethylene oxide, polyethylene oxide, propylene oxide, polypropylene oxide, epichlorohydrin or caprolactone, may also be used.

As other examples, urethane acrylates obtained by reacting an isocyanate group-containing (meth)acrylate such as acryloyloxyethyl isocyanate or methacryloyloxyethyl isocyanate to the above-mentioned polyhydric alcohol, or reacting a hydroxyl group-containing (meth)acrylate such as 2-hydroxyethyl (meth)acrylate to a polyhydric isocyanate compound, may also be employed.

Further, a derivative of phosphoric acid such as an acryloyloxyethyl ester or methacryloyloxyethyl ester may also be employed.

In addition to the above examples, photopolymerizable monomers and oligomers which are disclosed at pages 11 to 65 of "UV/EB Koka Handbook-Materials-" compiled by Kiyoshi Kato (Kobunshi Kankokai) and at pages 7 to 55 of "UV-EB Koka Gijutsu no Ouyo to Shijo" complied by Radoteck Kenkyukai under supervision of Yoneho Tabata (CMC), may also be used.

The ethylenic compound which can be used in the present invention, is by no means limited to the above-mentioned specific examples and the methods for preparation.

Further, a plurality of such ethylenic compounds may be used in combination in the photosensitive composition. The component (1) is used usually in an amount of from 5 to 70 wt %, preferably from 10 to 60 wt %, based on the total solid content of the photosensitive composition.

In the present invention, the acidic vinyl copolymer (2) soluble or swellable in alkaline water, which contains, in its molecule, a vinyl monomer having an aromatic hydroxyl group, as a constituting unit. In another words, the acidic vinyl copolymer is obtained by copolymerization of at least one kind of a vinyl monomer having an aromatic hydroxyl group with other monomer, preferably with at least one vinyl monomer having no aromatic hydroxyl group. It is not particularly limited so long as it is an acidic vinyl copolymer soluble or swellable in alkaline water, which has a hydroxy aromatic ring derived from a vinyl monomer having an aromatic hydroxyl group, on a side chain of the copolymer. For example, it may be a copolymer obtained by copolymerizing a vinyl monomer having an aromatic hydroxyl group, specifically at least one member selected from the group consisting of aromatic hydroxyl group-containing (meth)acrylamides such as N-(4-hydroxyphenyl)(meth) acrylamide, N-(3-hydroxyphenyl)(meth)acrylamide, and N-(2-hydroxyphenyl)(meth)acrylamide, aromatic hydroxyl group-containing styrenes such as o,m,p-hydroxystyrenes, aromatic hydroxyl group-containing (meth)acrylates such as o,m,p-hydroxyphenyl (meth)acrylates and aromatic hydroxyl group-containing maleimides such as N-(4-hydroxyphenyl)maleimide, N-(3-hydroxyphenyl) maleimide, and N-(2-hydroxyphenyl)maleimide, with at least one member selected from the group consisting of vinyl monomers having no aromatic hydroxyl group as shown in the following (a) to (k).

(a) An acrylic acid ester or a methacrylic acid ester having an aliphatic hydroxyl group, i.e. a hydroxyalkyl (meth)acrylate such as 2-hydroxyethylacrylate, 2-hydroxyethyl methacrylate, 4-hydroxybutyl acrylate, or 4-hydroxybutyl methacrylate;

(b) an α,β-unsaturated carboxylic acid such as acrylic acid, methacrylic acid, maleic anhydride or itaconic acid;

(c) a (substituted)alkyl acrylate such as methyl acrylate, ethyl acrylate, propyl acrylate, butyl acrylate, amyl acrylate, hexyl acrylate, octyl acrylate, 2-chloroethyl acrylate, glycidyl acrylate or N-dimethylaminoethyl acrylate;

(d) a (substituted)alkyl methacrylate such as methyl methacrylate, ethyl methacrylate, propyl methacrylate, butyl methacrylate, amyl methacrylate, cyclohexyl methacrylate, 4-hydroxybutyl methacrylate, glycidyl methacrylate or N-dimethylaminoethyl methacrylate;

(e) an acrylamide or a methacrylamide such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide, or N-ethyl-N-phenylacrylamide;

(f) a vinyl ether such as ethyl vinyl ether, 2-chloroethyl vinyl ether, hydroxyethyl vinyl ether, propyl vinyl ether, butyl vinyl ether, octyl vinyl ether, or phenyl vinyl ether;

(g) a vinyl ester of an aliphatic or aromatic carboxylic acid, such as vinyl acetate, vinyl chloroacetate, vinyl butyrate, or vinyl benzoate;

(h) a styrene such as styrene, α-methylstyrene, methylstyrene, or chloromethyl styrene;

(i) a vinyl ketone of an aliphatic or aromatic hydrocarbon, such as methyl vinyl ketone, ethyl vinyl ketone, propyl vinyl ketone, or phenyl vinyl ketone;

(j) an olefin such as ethylene, propylene, isobutylene, butadiene, or isoprene;

(k) N-vinylpyrrolidone, N-vinylcarbazole, 4-vinylpyridine, acrylonitrile, methacrylonitrile, or the like.

In the above (a) to (k), "alkyl" usually means $C_{1-12}$ alkyl.

Further, other monomers copolymerizable with the above monomers, may be copolymerized. The acidic vinyl copolymer in the present invention preferably contains an unsaturated carboxylic acid mentioned in the above (b) from the viewpoint of the developing property.

Among the above vinyl monomers having aromatic hydroxyl groups, at least one member selected from the group consisting of aromatic hydroxyl group-containing (meth)acrylamides, (meth)acrylates and maleimides, may be used particularly advantageously. Further, among the vinyl monomers of the above (a) to (k), those mentioned in (a), (b), (c), (d) and (k) are preferred. Particularly preferred is the one using (meth)acrylic acid, $C_{1-4}$ alkyl esters of (meth) acrylic acid, and at least one member selected from the group consisting of hydroxy $C_{1-4}$ alkyl esters of (meth) acrylic acid and acrylonitrile, in combination.

The acidic vinyl copolymer (2) preferably has an acid value of from 10 to 100, and its preferred molecular weight is from 30,000 to 130,000.

In the present invention, the acidic vinyl copolymer is used usually in an amount of from 20 to 85 wt %, preferably from 30 to 80 wt %, based on the solid content of the photosensitive composition.

In the present invention, the photopolymerization initiator (3) is not particularly limited, and conventional initiators can be used. For example, benzoin, a benzoinalkyl ether, benzophenone, an anthraquinone compound, Michler's ketone, a trihalomethyl-s-triazine compound, an oxadiazole compound, a biimidazole compound, a thioxanthone compound and an aromatic tertiary amine may suitably be employed. These photopolymerizable initiators may be used alone or in combination as a mixture of two or more of them. Specific examples of such photopolymerizable initiators and preferred examples for combined use are disclosed, for example, at pages 67 to 73 of "UV/EB Koka Handbook —Materials—" compiled by Kiyoshi Kato (Kobunshi Kankokai), at pages 64 to 82 of "UV/EB Koka Gijutsu no Ouyo to Shijo" complied by Radoteck Kenkyukai under supervision of Yoneho Tabata (CMC), in Japanese Examined Patent Publication No. 42074/1994 and Japanese Unexamined Patent Publications No. 61044/1987, No. 35725/1985 and No. 287547/1990. Further, compounds which are capable of generating acids under irradiation with active light rays as disclosed in Japanese Unexamined Patent Publications No. 362643/1992 and No. 362644/1992, may also be used as the photopolymerization initiator.

The photopolymerization initiator which can be used in the present invention is by no means limited to the above-mentioned specific examples.

In the present invention, the photopolymerization initiator is used usually in an amount of from 0.2 to 30 wt %, preferably from 0.5 to 10 wt %, based on the solid content of the photosensitive composition.

In the present invention, the diazo resin (4) is a copolycondensed compound which contains in its molecule, an aromatic compound having a carboxyl group and/or a hydroxyl group, and an aromatic diazonium compound, as constituting units. In another words, the diazo resin (4) is obtained by copolycondensation reaction of at least one aromatic compound having a carboxyl group and/or a hydroxyl group with an aromatic diazonium compound, and other compound if necessary.

The above aromatic compound having a carboxyl group and/or a hydroxyl group is the one which contains, in its molecule, an aromatic ring substituted by at least one carboxyl group and/or an aromatic ring substituted by at least one hydroxyl group. In this case, the carboxyl group and the hydroxyl group may both be substituted on the same aromatic ring.

As the above aromatic ring, preferably, an aryl group such as a phenyl group or a naphthyl group, may, for example, be mentioned.

The carboxyl group or the hydroxyl group may directly be bonded to the aromatic ring or may be bonded thereto via a linking group (hereinafter referred to simply as a joint).

In the above case, the number of carboxyl groups bonded to one aromatic ring is preferably 1 or 2, and the number of hydroxyl groups bonded to one aromatic ring is preferably from 1 to 3. Further, as the joint, a $C_{1-4}$ alkylene group may, for example, be mentioned.

Specific examples of the above aromatic compound containing a carboxyl group and/or a hydroxyl group include benzoic acids (excluding salicylic acid and its derivatives) which may be substituted by hydroxyl groups and may further have other substituents, such as benzoic acid, (o,m,p)-chlorobenzoic acid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)-benzoic acid, 4-(p-methoxybenzoyl) benzoic acid, 4-(p-methylanilino)benzoic acid, 4-phenylsulfonylbenzoic acid, p-hydroxybenzoic acid, 2-methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-methylbenzoic acid, 4-chloro-2,6-dihydroxybenzoic acid, 4-methoxy-2,6-dihydroxybenzoic acid, 2,4,5-trihydroxybenzoic acid, p-hydroxymethylbenzoic acid, p-hydroxyethylbenzoic acid, 4-(p-hydroxyphenyl) methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino) benzoic acid, 4-(p-hydroxyphenylsulfonyl)benzoic acid, and 4-(p-hydroxyphenylthio)benzoic acid;

Salicylic acids which may have substituents, such as salicylic acid, 4-methylsalicylic acid, 6-methylsalicylic acid, 4-ethylsalicylic acid, 6-propylsalicylic acid, 6-laurylsalicylic acid, 6-stearylsalicylic acid, and 4,6-dimethylsalicylic acid; and phthalic acid, terephthalic acid, diphenylacetic acid, phenoxyacetic acid, p-methoxyphenylacetic acid, phenol, (o,m,p)-cresol, xylenol, resorcinol, 2-methylresorcinol, (o,m,p)-methoxyphenol, m-ethoxyphenyl, catechol, fluoroglycinol, p-hydroxyethylphenyl, naphthol, pyrogallol, hydroquinone, p-hydroxybenzylalcohol, 4-chlororesorcinol, biphenyl 4,4'-diol, 1,2,4-benzenetriol, bisphenol A, 2,4-dihydroxybenzophenone, 2,3,4-trihydroxybenzophenone, p-hydroxyacetophenone, 4,4'-dihydroxydiphenyl ether, 4,4'-dihydroxydiphenylamine, 4,4'-dihydroxydiphenylsulfidecumylphenyl, (o,m,p)-chlorophenol, (o,m,p)-bromophenol, gullic acid, fluoroglycinecarboxylic acid, m-galloylgallic acid, tannic acid, m-benzoylgullic acid, m-(p-toluyl)gullic acid, protocatechuoylgallic acid, 4,6-dihydroxyphthalic acid, (2,4-dihydroxyphenyl)acetic acid, (2,4-dihydroxyphenyl)acetic acid, (3,4,5-trihydroxyphenyl)acetic acid, and bis(3-carboxy-4-hydroxyphenyl)amine. As the substituents, for benzoic acids and salicylic acids, hydroxyl group, alkyl groups, alkoxy groups and halogen atoms are preferred. The alkyl group may be $C_{1-12}$ alkyl, the alkoxyl groups may be $C_{1-12}$ alkoxy groups, and the halogen atoms may be chlorine or bromine atoms.

Among the above compounds, compounds in which the carboxyl group and/or the hydroxyl group is directly bonded to the aromatic ring, are preferred. Among them, at least one member selected from the group consisting of bonzoic acids and salicylic acids is preferred. Particularly preferred is salicylic acid, p-hydroxybenzoic acid, p-methoxybenzoic acid, or m-chlorobenzoic acid.

As the aromatic diazonium compound as the constituting unit of the above-mentioned copolycondensed diazo resin, diazonium salts as disclosed in Japanese Examined Patent Publication No. 48001/1974 may, for example, be used. Particularly preferred are diphenylamine-4-diazonium salts which may have substituents.

The diphenylamine-4-diazonium salts are the diazonium salts of 4-amino-diphenylamines. Such 4-aminodiphenylamines include, for example, 4-amino-diphenylamines which may have substituents, such as 4-amino-diphenylamine, 4-amino-3-methoxy-diphenylamine, 4-amino-2-methoxy-diphenylamine, 4-amino-2'-methoxy-diphenylamine, 4-amino-4'-methoxy-diphenylamine, 4-amino-3-methyldiphenylamine, 4-amino-3-ethoxy-diphenylamine, 4-amino-3-β-dihydroxy-ethoxydiphenylamine, 4-amino-diphenylamine-2-sulfonic acid, 4-amino-diphenylamine-2-carboxylic acid, and 4-amino-diphenylamine-2'-carboxylic acid. As the substituents, $C_{1-4}$ alkyl groups, $C_{1-4}$ alkoxy groups, $C_{1-4}$ hydroxyalkoxy groups, a sulfo group and a carboxyl group may, for example, be mentioned. Among 4-aminodiphenylamines, 4-amino-diphenylamines which may be substituted by $C_{1-4}$ alkoxy groups are preferred. Particularly preferred is 4-amino-4'-methoxy-diphenylamine, or 4-amino-diphenylamine.

The above-mentioned copolycondensed diazo resin can be obtained by polycondensing a diazonium salt, an aromatic compound having a carboxyl group and/or a hydroxyl group, and an aldehyde such as paraformaldehyde, acetoaldehyde or benzaldehyde, or a ketone such as acetone or acetophenone, in sulfuric acid, phosphoric acid or hydrochloric acid, in accordance with a conventional method such as a method disclosed in e.g. Photo. Sci. Eng., vol 17, p. 33 (1973), or U.S. Pat. Nos. 2,063,631 and 2,679,498.

Further, the aromatic compound having, in its molecule, a carboxyl group and/or a hydroxyl group, the aromatic diazo compound and the aldehyde or the ketone may freely be combined, and two or more different compounds may be used in combination for the respective reactants for copolycondensation. The molar ratio of the aromatic compound having a carboxyl group and/or a hydroxyl group to the aromatic diazo compound is usually from 1:0.1 to 0.1:1, preferably from 1:0.5 to 0.2:1, more preferably from 1:1 to 0.2:1. In such a case, the molar ratio of the total amount of the aromatic compound having a carboxyl group and/or a hydroxyl group and the aromatic diazo compound, to the aldehyde or the ketone, is usually from 1:0.6 to 1:1.5, preferably from 1:0.7 to 1:1.2. The polycondensed diazo resin can be obtained by the reaction at a low temperature for a short period of time, e.g. for 3 hours.

The counter anion of the diazo resin to be used in the present invention includes an anion which forms a stable salt with the diazo resin and which makes the resin soluble in an organic solvent. Such a counter anion includes organic carboxylic acids such as decanoic acid and benzoic acids, organic phosphoric acids such as phenylphosphoric acid, and sulfonic acids. Typical examples include aliphatic and aromatic sulfonic acids such as methanesulfonic acid, chloroethanesulfonic acid, dodecanesulfonic acid, benzenesulfonic acid, toluenesulfonic acid, mesitylenesulfonic acid, anthraquinonesulfonic acid, 2-hydroxy-4-methoxybenzophenone-5-sulfonic acid, hydroxysulfonic acid, 4-acetylbenzenesulfonic acid, and dimethyl-5-sulfoisophthalate, hydroxyl group-containing aromatic compounds such as 2,2',4,4'-tetrahydroxybenzophenone, 1,2,3-trihydroxybenzophenone, and 2,2',4-trihydroxybenzophenone, halogenated Lewis acids such as hexafluorophosphoric acid, and tetrafluoroboric acid, and perhalogeno acids such as $ClO_4$ and $IO_4$. However, it is not limited to such specific examples. Among them, particularly preferred is hexafluorophosphoric acid, tetrafluoroboric acid, or 2-hydroxy-4-methoxybenzophenone-5-sulfonic acid.

The above-mentioned copolycondensed diazo resin can be obtained to have an optional molecular weight by changing the molar ratio of the respective monomers and the condensation conditions. For the purpose of the present invention, the molecular weight is selected usually within a range of from about 400 to 10,000, preferably from about 800 to 5,000.

Further, the photosensitive diazo resin to be used in the present invention is incorporated usually in an amount of from 1 to 20 wt %, preferably from 2 to 10 wt %, based on the solid content of the photosensitive composition.

The photosensitive composition of the present invention may further contain a coloring matter. The coloring matter is used for the purpose of obtaining a visible image by exposure (exposed visible image) and a visible image after development.

As such a coloring matter, it is preferred to employ the one which changes the color when reacted with free radicals or with an acid. Here, "changes the color" is intended to cover both a change from a colorless state to a colored state and a change from a color to a colorless state or to a different color. A preferred coloring matter is the one which changes the color by forming a salt with an acid. For example, triphenylmethane type, diphenylmethane type, oxazine type, xanthene type, iminonaphthoquinone type, azomethine type or anthraquinone type coloring matters including Victoria Pure Blue BOH (manufactured by Hodogaya Chemical Co., Ltd.), Oil Blue #603 (manufactured by Orient Kagaku Kogyo K.K.), Patent Pure Blue (manufactured by Sumitomo Mikuni Kagaku K.K.), crystal violet, brilliant green, ethyl violet, methyl violet, methyl green, erythrosine B, basic fuchsin, malachite green, oil red, m-cresol purple, rhodamine B, auramine, 4-p-diethylaminophenyliminonaphthoquinone, and cyano-p-diethylaminophenylacetoanilide, may be mentioned as examples of coloring matters which undergo a color change from a certain color to a colorless state or to a different color.

On the other hand, as coloring matters which undergo a change to have a color from a colorless state, leuco dyes and primary or secondary arylamine coloring matters including, for example, triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p',p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane, and p,p',p"-triaminotriphenylmethane, may be mentioned.

Particularly preferred is triphenylmethane type or diphenylmethane type coloring matters. Triphenylmethane type coloring matters are more preferred. Particularly preferred is Victoria Pure Blue BOH.

The above coloring matter is incorporated usually in an amount of from 0.5 to 10 wt %, preferably from about 1 to 5 wt %, based on the total solid content of the photosensitive composition.

To the photosensitive composition of the present invention, various other additives may be added.

For example, an alkyl ether (such as ethyl cellulose or methyl cellulose), a fluorine type surfactant, a nonionic surfactant (such as Pulronic L-64 (manufactured by Asahi Denka K.K.)) to improve the coating property, a plasticizer to impart flexibility and abrasion resistance to the coating film (such as butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and polymer of acrylic acid or methacrylic acid), oleophilic agent to give oleophilic property to the image portion (such as a half esterified product of a styrene-maleic anhydride copolymer with an alcohol, as disclosed in e.g. Japanese Unexamined Patent Publication No. 527/1980), a stabilizer (such as phosphoric acid, phosphorous acid, an organic acid such as citric acid, oxalic acid, benzenesulfonic acid, naphthalenesulfonic acid, 4-methoxy-2-hydroxybenzophenone-5-sulfonic acid or tartaric acid), a development-accelerator (such as a higher alcohol or an acid anhydride) may be mentioned. The amount of these additives varies depending upon the particular purpose, but is usually from 0.01 to 30 wt %, based on the total solid content of the photosensitive composition.

When such a photosensitive composition is used for preparation of a photosensitive lithographic plate, it is coated on a suitable support.

As the support to be used for such a photosensitive lithographic plate, paper, a plastic (such as polyethylene, polypropylene or polystyrene), laminated paper, a plate of a metal such as aluminum (inclusive of an aluminum alloy), zinc or copper, a film of a plastic such as cellulose diacetate, cellulose triacetate, cellulose propionate, polyethylene terephthalate, polyethylene, polypropylene, polycarbonate or polyvinyl acetal, a paper or plastic film having the above metal laminated or vapor-deposited, or a steel plate plated with aluminum or chromium, may, for example, be mentioned. Among them, an aluminum substrate or a composite substrate coated with aluminum is preferred.

Further, the surface of such an aluminum material is preferably treated by roughening treatment in order to improve the adhesion to the photosensitive layer and to increase the water-retaining property.

As the surface roughening method, a conventional method such as brushing, ball abrading, electrolytic etching, chemical etching, liquid honing or sandblasting, or a combination thereof may be mentioned. Preferably, brushing, electrolytic etching, chemical etching or liquid honing may be mentioned. Among them, particularly preferred is a surface roughening method using electrolytic etching. As an electrolytic bath to be used for the electrolytic etching, an aqueous solution containing an acid, an alkali or a salt thereof, or an aqueous solution containing an organic solvent, may be employed. Among them, particularly preferred is an electrolyte containing hydrochloric acid, nitric acid or a salt thereof. Further, the aluminum plate treated by the surface roughening treatment may further be subjected to death mat treatment with an aqueous solution of an acid or an alkali, as the case requires. The aluminum plate thus prepared is preferably subjected to anodic oxidation treatment. Particularly preferred is a method of treating it in a bath containing sulfuric acid or phosphoric acid. Further, if necessary, surface treatment such as treatment by an alkali metal silicate or hot water, or dipping in an aqueous solution containing a water-soluble polymer compound or potassium zirconium fluoride, may be applied.

As such a water-soluble polymer compound, a carboxymethyl cellulose or its alkali metal salt, polyvinylsulfonic acid, dextrin, gum arabic, pectin, carrageenan, hydroxyethyl cellulose, alginic acid or its alkali metal salt, polyacrylic acid, or polyvinyl alcohol may, for example, be mentioned.

To apply the above photosensitive composition on the support, predetermined amounts of the compound (1), the copolymer (2), the photopolymerization initiator (3) and the diazo resin (4) as well as various optional additives, are dissolved in a suitable solvent (methyl cellosolve, ethyl cellosolve, methyl cellosolve acetate, acetone, methyl ethyl ketone, methanol, dimethylformamide, dimethylsulfoxide, propylene glycol monomethyl ether, propylene glycol monoethyl ether, methyl lactate, ethyl lactate, 4-hydroxy-2-butanone, methyl diglycol, water or a mixture thereof) to obtain a coating solution of the photosensitive composition, and the coating solution is coated on the support and dried. The concentration of the photosensitive composition at the time of coating is usually within a range of from 1 to 50 wt %. In this case, the amount of the photosensitive composition to be coated is at a level of from 0.2 to 10 g/m$^2$.

On the layer of the photosensitive composition formed on the substrate, a protective layer made of a polymer excellent in an oxygen-shielding property, such as polyvinyl alcohol or an acidic cellulose, may be formed in order to prevent polymerization due to oxygen in air.

For the exposure and development of the photosensitive material coated on the support, a conventional method may be used. Namely, exposure is conducted through a transparent original image having a line image or a net dot image, followed by development with an aqueous developer, to obtain a negative relief image to the original image. As a light source for an active light suitable for exposure, a carbon arc lamp, a mercury lamp, a xenon lamp, a metal halide lamp or a strobo may, for example, be mentioned.

The developer for the photosensitive composition of the present invention is not particularly limited. However, particularly preferred is an alkaline aqueous solution which contains no substantial organic solvent. The term "contains no substantial organic solvent" means that an organic solvent is not contained so as to impair the hygiene or the safety, and usually there is no problem if its content is not more than 1 wt % in the composition of the developer.

A preferred content of an organic solvent is not higher than 0.5 wt %, more preferably not contained at all. As an alkali to be used for the developer, potassium silicate, lithium silicate, sodium silicate, sodium hydroxide, potassium hydroxide, lithium hydroxide, sodium tertiary phosphate, sodium secondary phosphate, potassium tertiary phosphate, potassium secondary phosphate, sodium carbonate or potassium carbonate may preferably be mentioned. Among them, a developer containing an alkali metal silicate such as potassium silicate, lithium silicate or sodium silicate is most preferred, since it provides good gradation for development. It is preferred to employ a developer wherein the composition of the alkali metal silicate is represented by a molar ratio of $(SiO_2)/(M)=0.5$ to $1.5$ (here $(SiO_2)$ and $(M)$ represent the molar concentration of $SiO_2$ and the molar concentration of the total alkali metals), and $SiO_2$ is contained in an amount of from 0.8 to 8 wt %. In such an alkali metal silicate composition, particularly preferred is a developer wherein the molar ratio of $(SiO_2)/(M)=0.5$ to $0.75$, and $SiO_2$ is contained in an amount of from 0.8 to 4 wt %, since it is thereby easy to neutralize the waste liquid from development, since the concentration is low. On the other hand, a developer with a molar ratio of from 0.75 to 1.3 and with a $SiO_2$ content of from 1 to 8 wt % is preferably employed, since such a developer has a high buffering effect, and the treating ability is high. The pH (25° C.) of the developer of the present invention is at least 12, preferably from 12.5 to 14. In the developer, a water soluble sulfite such as sodium sulfite, potassium sulfite, lithium sulfite, lithium sulfite or magnesium sulfite may, for example, be added. Such a sulfite is preferably contained in an amount of from 0.05 to 4 wt %, more preferably from 0.1 to 1 wt %, in the composition of the developer.

Further, the developer may further contain at least one surfactant selected from the group consisting of anionic surfactants and amphoteric surfactants as disclosed in Japanese Unexamined Patent Publication No. 51324/1975 and nonionic surfactants as disclosed in Japanese Unexamined Patent Publications No. 75255/1984 and No. 111246/1985, or a polymer electrolyte as disclosed in Japanese Unexamined Patent Publications No. 95946/1980 and No. 142528/1981, so that the wettability of the developer to the photosensitive composition may be improved, or the gradation may be further improved. There is no particular restriction as to the amount of such a surfactant, but it is usually from 0.003 to 3 wt %, preferably from 0.006 to 1 wt %. Further, as an alkali metal of the alkali metal silicate, potassium is preferably contained in an amount of 20 mol %, based on the total alkali metal, whereby formation of insoluble matters in the developer can be minimized. More preferably, potassium is contained in an amount of at least 90 mol %, most preferably, potassium is 100 mol %.

Further, to the developer to be used in the present invention, a defoaming agent may be incorporated. As a suitable defoaming agent, an organic silane compound may, for example, be mentioned.

The photosensitive composition of the present invention is excellent in all of the alkali developing properties, the smudge resistance, the printing resistance and the storage stability.

Now, the present invention will be described in further detail with reference to Examples and Comparative Examples. However, it should be understood that the present invention is by no means restricted by such specific Examples.

Preparation of diazo resin 1

3.5 g (25 mmol) of p-hydroxybenzoic acid and 21.75 g (75 mmol) of p-diazodiphenylamine sulfate were dissolved in 90 g of concentrated sulfuric acid under cooling with ice. To this solution, 2.7 g (90 mmol) of paraformaldehyde was gradually added. At that time, addition was carried out so that the reaction temperature did not exceed 10° C. The reaction solution was stirred for 2 hours and then dropwise added to 1 l of ethanol, whereupon formed precipitate was collected by filtration and washed with ethanol. The precipitate was dissolved in 200 ml of pure water, and an aqueous solution having 10.5 g of zinc chloride dissolved therein, was added. Formed precipitate was collected by filtration, washed with ethanol and then dissolved in 300 ml of pure water. To this solution, 13.7 g of an aqueous solution having 13.7 g of ammonium hexafluorophosphate dissolved therein, was added. Formed precipitate was collected by filtration, washed with water and ethanol and then dried at 25° C. for one day to obtain diazo resin 1. This diazo resin was subjected to gel permeation chromatography (hereinafter referred to simply as GPC), and the molecular weight was measured, whereby the weight average molecular weight was found to be about 2,300.

Preparation of diazo resin 2

Diazo resin 2 was prepared in the same manner as in the preparation of diazo resin 1 except that the p-diazophenylamine sulfate for diazo resin 1 was changed to 24.3 g (75 mmol) of 4-diazo-4'-methoxydiphenylamine sulfate. The molecular weight was measured by GPC, whereby the weight average molecular weight was found to be about 2,500.

EXAMPLE 1

The aluminum plate was degreased with 3% sodium hydroxide, and it was subjected to electrolytic etching in a 11.5 g/l hydrochloric acid bath at 25° C. at a current density of 80 A/dm² for 11 seconds, then washed with water and subjected to anodic oxidation in 30% sulfuric acid bath at 30° C. at a current density of 11.5 A/dm² for 15 seconds. Then, it was treated with a 1% sodium metasilicate aqueous solution at 85° C. for 30 seconds, then washed with water and dried to obtain a lithographic aluminum plate.

Then, the following photosensitive liquid I was prepared.

Photosensitive liquid I

| | |
|---|---|
| Trimethylolpropane triacrylate | 0.3 g |
| Copolymer of poly(N-(4-hydroxyphenyl)methacrylamide/acrylonitrile/methyl methacrylate/methacrylic acid) in a molar ratio of 25/25/42/8 (Mw: 42,000) | 0.3 g |
| DETX (following structure (a)), manufactured by Nippon Kayaku K.K. | 0.03 g |
| EPA (following structure (b)), manufactured by Nippon Kayaku K.K. | 0.03 g |
| Diazo resin 1 | 0.024 g |
| Victoria Pure Blue BOH (tradename, Hodogaya Chemical Co., Ltd.) | 0.012 g |
| Jurymer AC-10L (tradename, Nippon Junyaku K.K.) | 0.012 g |
| methyl cellosolve | 8.0 g |

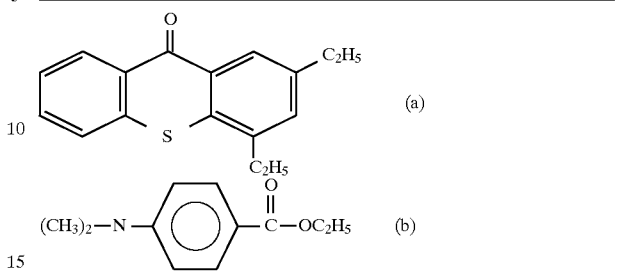

Photosensitive liquid I was filtered and then coated on a support by a bar coater so that the dried weight would be 1.5 g/m². Some of the photosensitive lithographic plates thus obtained were stored at 40° C. under a relative humidity of 80% for 3 days.

To each of the obtained non-stored photosensitive lithographic plate and the photographic lithographic plate after storage, a negative transparent original image was fitted under vacuum, then exposed for 30 seconds from a distance of 60 cm by a 2 kW metal halide lamp, then immersed in the developer having the following composition at 25° C. for 40 seconds and then developed by gently rubbing with absorbent cotton.

Developer

| | |
|---|---|
| Potassium silicate (A type): | 225 g |
| Potassium hydroxide: | 25 g |
| Pure water: | 1,000 g |

After the development, no scar was observed at the solid portion and the dotted portion of the photosensitive lithographic plate, thus indicating excellent alkali developing properties.

By using each of the obtained non-stored lithographic plate and the lithographic plate after the storage, printing was carried out on woodfree paper by means of a commercially available ink ("Toyo Hiplus M-beni", tradename, manufactured by Toyo Ink K.K.) by a Diaprinting machine, manufactured by Mitsubishi Heavy Industry Co., Ltd., whereby no smudging was formed at the non-image line portion, thus indicating excellent smudge resistance, in each of the non-stored and stored photosensitive lithographic plates, and with respect to each printing plate, printing was carried out on 60,000 sheets without any trouble, thus showing excellent printing resistance.

COMPARATIVE EXAMPLE 1

The operation was conducted in the same manner as in Example 1 except that the total amount of the copolycondensed diazo resin 1 corresponding to component (4) of photosensitive liquid I was changed to a hexafluorophosphate of a condensation product of p-diazodiphenylamine with formaldehyde/(weight average molecular weight: 1,500), whereby with respect to each of the non-stored and stored printing plates, partial smudging was observed at the time of printing, and smudge resistance was inadequate.

COMPARATIVE EXAMPLE 2

The operation was conducted in the same manner as in Example 1 except that the total amount of the copolymer of poly(N-(4-hydroxyphenyl)methacrylamide/acrylonitrile/methyl methacrylate/methacrylic acid) in a molar ratio of 25/25/42/8 corresponding to component (2) of photosensitive liquid I was changed to a copolymer of poly (acrylonitrile/methyl methacrylate/methacrylic acid) in a molar ratio of 25/67/8 (weight average molecular weight: 38,000), whereby with respect to each of the non-stored and stored printing plates, smudging was observed over the entire paper surface at the time of printing, and smudge resistance was very poor.

COMPARATIVE EXAMPLE 3

The operation was conducted in the same manner as in Example 1 except that instead of photosensitive liquid I in Example 1, the following photosensitive liquid II was used, whereby with a non-stored plate, scars were observed at the solid portion and the dotted portion of the printing plate after the development. With respect to the stored printing plate, film peeling occurred at the time of the development, and the plate was not suitable for printing. With respect to the non-stored printing plate, printing was possible only on 30,000 sheets.

Photosensitive liquid II

| | |
|---|---|
| Copolymer of poly (N-(4-hydroxyphenyl)methacrylamide/acrylonitrile/methyl methacrylate/methacrylic acid) in a molar ratio of 25/25/42/8 (Mw: 42,00) | 0.6 g |
| Diazo resin 1 | 0.060 g |
| Victoria Pure Blue BOH | 0.012 g |
| Jurymer AC-10L | 0.012 g |
| Methyl cellosolve | 8.0 g |

EXAMPLE 2

The operation was conducted in the same manner as in Example 1 except that instead of photosensitive liquid I in Example 1, the following photosensitive liquid III was used, whereby in the same manner as in Example 1, with respect to each of the non-stored and stored printing plates, excellent alkali developing properties and smudge resistance were observed, and printing resistance of 60,000 sheets was observed.

Photosensitive liquid III

| | |
|---|---|
| Pentaerythritol triacrylate | 0.3 g |
| Copolymer of poly(N-(4-hydroxyphenyl)maleimide/2-hydroxyethylmethacrylate/methyl methacrylate/methacrylic acid) in a molar ratio of 25/25/42/8 (Mw: 40,000) | 0.3 g |
| Photopolymerization initiator of the following structure (c) | 0.03 g |
| Copolycondensed diazo resin 2 | 0.024 g |
| Victoria Pure Blue BOH | 0.012 g |
| Jurymer AC-10L | 0.012 g |
| Methyl cellosolve | 8.0 g |

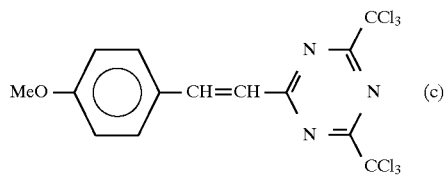

EXAMPLE 3

The operation was conducted in the same manner as in Example 1 except that instead of photosensitive liquid I in Example 1, the following photosensitive liquid IV was used, whereby in the same manner as in Example 1, with respect to each of the non-stored and stored printing plates, excellent alkali developing properties and smudge resistance were observed, and printing resistance of 70,000 sheets was observed.

photosensitive liquid IV

| | |
|---|---|
| Glycerol diacrylate | 0.3 g |
| Copolymer of poly(N-(4-hydroxyphenyl)-methacrylamide/ethylacrylate/acrylonitrile/methacrylic acid) in a molar ratio of 8/60/24/8 (Mw: 55,000) | 0.7 g |
| Photopolymerization initiator of the above structure (c) | 0.02 g |
| Diazo resin 1 | 0.06 g |
| Victoria Pure Blue BOH | 0.02 g |
| Jurymer AC-10L | 0.06 g |
| Fluorad FC-430 (tradename, manufactured by 3M) | 0.01 g |
| Methyl lactate | 15 g |
| Propylene glycol monoethyl ether | 3 g |

We claim:

1. A method for developing a photosensitive lithographic plate, which comprises exposing to light, a photosensitive lithographic plate having a photosensitive composition comprising (1) a compound having at least one addition-polymerizable ethylenically unsaturated double bond, (2) an acidic vinyl copolymer soluble or swellable in alkaline water, which contains, in its molecule, a vinyl monomer having an aromatic hydroxyl group, as a constituting unit, (3) a photopolymerization initiator, and (4) a diazo resin, wherein said diazo resin is a polycondensed compound which contains, in its molecule, an aromatic compound having a carboxyl group or a hydroxyl group, or both carboxyl and hydroxyl groups and an aromatic diazonium compound, as constituting units, provided on a support, and developing said photosensitive lithographic plate with an alkali developer containing not higher than 0.5 wt. % of an organic solvent.

2. The method according to claim 1, wherein the aromatic compound having a carboxyl group and/or a hydroxyl group, is a compound having a carboxyl group and/or a hydroxyl group directly bonded to an aromatic ring.

3. The method according to claim 1, wherein the aromatic compound having a carboxyl group and/or a hydroxyl group is at least one member selected from the group consisting of benzoic acids and salicylic acids.

4. The method according to claim 1, wherein the aromatic compound having a carboxyl group and/or a hydroxyl group is at least one member selected from the group consisting of salicylic acid, p-hydroxybenzoic acid, p-methoxybenzoic acid and m-chlorobenzoic acid.

5. The method according to claim 1, wherein the aromatic diazonium compound is a diphenylamine-4-diazonium salt which may have substituents.

6. The method according to claim 1, wherein the aromatic diazonium compound is a diazonium salt of 4-amino-diphenylamine which may be substituted by a $C_{1-4}$ alkoxy group.

7. The method according to claim 1, wherein the acidic vinyl copolymer has an acid value of from 10 to 100.

8. The method according to claim 1, wherein the acidic vinyl copolymer is a copolymer of at least one member selected from the group consisting of aromatic hydroxyl group-containing (meth)acrylamides, (meth)acrylates and maleimides, with at least one vinyl monomer having no aromatic hydroxyl group.

9. The method according to claim 8, which contains at least an α,β-unsaturated carboxylic acid as the vinyl monomer having no aromatic hydroxyl group.

10. The method according to claim 8, which contains (meth)acrylic acid, $C_{1-4}$ alkyl esters of (meth)acrylic acid, and at least one member selected from the group consisting of hydroxy $C_{1-4}$ alkyl esters of (meth)acrylic acid and acrylonitrile, as the vinyl monomer having no aromatic hydroxyl group.

11. The method according to claim 1, which comprises from 5 to 70 wt % of the compound having at least one addition-polymerizable ethylenically unsaturated double bond, from 20 to 85 wt % of the acidic vinyl copolymer, from 0.2 to 30 wt % of the photopolymerization initiator and from 1 to 20 wt % of the diazo resin, based on the total solid content in the photosensitive composition.

12. The photosensitive method of claim 1, wherein said compound having at least one addition-polymerizable ethylenically unsaturated double bond containing an acryloyl group or methacryloyl group, is selected from the group consisting of a linear or cyclic alkyl (meth)acrylate, a (meth)acrylate of an aromatic alcohol, a mono(meth) acrylate of a polyhydric alcohol, a polyethylene oxide (meth)acrylate, a polypropylene oxide (meth)acrylate, a fluorinated alkyl (meth)acrylate, a glycidyl (meth)acrylate, a hydroxy group-containing alkyl (meth)acrylate, and an alkoxy group-containing alkyl (meth)acrylate.

13. The method of claim 1, wherein (2) said acidic vinyl copolymer soluble or swellable in alkaline water contains at least 8 mol % of vinyl monomer having an aromatic hydroxyl group.

14. A method for developing a photosensitive lithographic plate, which comprises exposing to light, a photosensitive lithographic plate having a photosensitive composition comprising (1) a compound having at least one addition-polymerizable ethylenically unsaturated double bond, (2) an acidic vinyl copolymer soluble or swellable in alkaline water, which contains, in its molecule, a vinyl monomer having an aromatic hydroxyl group, as a constituting unit, (3) a photopolymerization initiator, and (4) a diazo resin, wherein said diazo resin is a polycondensed compound which contains, in its molecule, an aromatic compound having a carboxyl group or a hydroxyl group, or both carboxyl and hydroxyl groups and an aromatic diazonium compound, as constituting units, provided on a support, and developing said photosensitive lithographic plate with an alkali developer containing no organic solvent.

* * * * *